United States Patent
Kim et al.

(10) Patent No.: US 7,662,716 B2
(45) Date of Patent: Feb. 16, 2010

(54) METHOD FOR FORMING SILICIDE CONTACTS

(75) Inventors: Hyun-Su Kim, Gyeonggi-Do (KR); Kwang-Jin Moon, Gyeonggi-Do (KR); Sang-Woo Lee, Seoul (KR); Eun-Ok Lee, Incheon (KR); Ho-Ki Lee, Gyeonggi-Do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 442 days.

(21) Appl. No.: 11/355,112

(22) Filed: Feb. 14, 2006

(65) Prior Publication Data

US 2007/0105358 A1 May 10, 2007

(30) Foreign Application Priority Data

Nov. 7, 2005 (KR) .................... 10-2005-0106099

(51) Int. Cl.
*H01L 21/28* (2006.01)
*H01L 21/44* (2006.01)
*H01L 21/4763* (2006.01)

(52) U.S. Cl. .................. 438/682; 438/581; 438/651; 257/E21.438; 257/E21.439

(58) Field of Classification Search ............. 438/581, 438/583, 630, 651, 682; 257/E21.468, E21.439
See application file for complete search history.

(56) References Cited

U.S. PATENT DOCUMENTS

| 6,169,025 | B1 | 1/2001 | Kuo | |
|---|---|---|---|---|
| 6,391,750 | B1 | 5/2002 | Chen et al. | |
| 2005/0202664 | A1 | 9/2005 | Jawarani | |
| 2006/0046398 | A1* | 3/2006 | McDaniel et al. | 438/279 |
| 2006/0121708 | A1* | 6/2006 | Lin et al. | 438/583 |

FOREIGN PATENT DOCUMENTS

| KR | 2000-0050300 | 8/2000 |
|---|---|---|
| KR | 10-2001-0003579 | 1/2001 |
| KR | 10-2001-0039174 | 5/2001 |

OTHER PUBLICATIONS

W. R. Runyan, et al. "Semiconductor Integrated Circuit Processing Technology" Copyright © 1990 by Addison-Wesley Publishing Company, Inc. 6 pages.
Badih El-Kareh "Fundamentals of Semiconductor Processing Technology" Copyright © 1995 by Kluwer Academic Publishers, 14pages.

* cited by examiner

*Primary Examiner*—Alexander G Ghyka
*Assistant Examiner*—Seahvosh J Nikmanesh
(74) *Attorney, Agent, or Firm*—Muir Patent Consulting, PLLC

(57) ABSTRACT

Contacts having different characteristics may be created by forming a first silicide layer over a first device region of a substrate, and then forming a second silicide layer over a second device region while simultaneously further forming the first silicide layer. A first contact hole may be formed in a dielectric layer over a first device region of a substrate. A silicide layer may then be formed in the first contact hole. A second contact hole may be formed after the first contact hole and silicide layer is formed. A second silicidation may then be performed in the first and second contact holes.

16 Claims, 6 Drawing Sheets

METHOD FOR FORMING SILICIDE CONTACTS

CROSS-REFERENCE TO RELATED APPLICATIONS

This U.S. non-provisional patent application claims priority and benefit of Korean Patent Application 2005-0106099 filed on 7 Nov. 2005, the entire contents of which are hereby incorporated by reference.

BACKGROUND

Integrated circuit (IC) chips include millions of transistors and other components fabricated on a substrate of semiconducting material such as silicon. The components are interconnected through lines of conductive material, most commonly aluminum. As IC chips increase in density and complexity, the dimensions of silicon features must be reduced in order to pack more components onto a single chip. One technical challenge in reducing feature size is maintaining adequate electrical connections between silicon features and the conductive lines. As the feature size decreases, the contact area between the metal and the silicon decreases, and thus, the contact resistance increases.

To provide more reliable contacts through smaller surface areas, certain metals such as refractory or near-noble metals may be used because they react with silicon to form silicides which create highly conductive and reliable contacts. A silicide contact is typically formed by depositing a thin layer of metal over silicon regions where contacts are to be formed, and then thermally treating it to cause the silicon and metal to react and form a silicide layer between the metal and silicon. Unreacted metal is removed, and the silicon features are then interconnected through conventional conductive lines which now contact the silicide layer rather than the silicon.

FIGS. 1-4 illustrate a prior art technique for forming silicide contacts. Referring to FIG. 1, a metal-oxide-semiconductor (MOS) transistor having a gate electrode 10 and source/drain regions 30 (also referred to as active regions) is first fabricated on a substrate 40 in a conventional manner. The gate electrode 10 includes a polysilicon gate layer 11, and a mask layer 13 which are stacked on top of an insulating layer 15 that covers the channel region of the substrate between the active regions 30. Spacers 20 are formed on the sidewalls of the gate electrode 10 and are typically used during the manufacturing process to provide accurate alignment of the active regions 30 with the sidewalls of the gate electrode 10. For example, the active regions 30 are typically heavily doped with impurities so that they are highly conductive. The sidewall spacers 20 facilitate the creation of lightly doped drain (LDD) regions in the portions of the active regions 30 that lie directly under the spacers. The LDDs tend to reduce the electric field strength and provide more accurate control of the impurity doping near the edges of the gate 10, both of which tend to critically effect the operation of the transistor.

Referring to FIG. 2, a dielectric layer 50 is deposited over the substrate, and then contact holes 51 are formed in the dielectric layer 50 to expose portions of the active regions 30. A thin layer of metal 60 is next deposited over the surface of the dielectric layer 50 as well as the exposed portions of the active regions 30. The entire device is then thermally treated to cause the metal at the bottom of the contact holes 51 to react with the silicon to form a silicide layer 70 as shown in FIG. 3. Unreacted metal is then removed, at least on the top of the dielectric layer 50, and interconnects are formed by depositing a layer of aluminum 80 in the contact holes 51 as shown in FIG. 4.

The characteristics of the silicide layer 70, e.g., thickness, resistance, and the like, may be controlled through various parameters such as the type of metal, annealing time and temperature, etc.

One particular problem with formation of a silicide layer is lateral growth of the silicide along the surface of the substrate. For example, encroachment of silicide under the sidewall spacers and even into the channel regions can result in increased leakage current and/or transistor failure. One prior art technique for preventing unwanted silicide encroachment involves implanting encroachment-inhibiting ions such as nitrogen into the active regions prior to thermal treatment.

Another problem is that certain transistors may be critical to the operating speed of the IC, and therefore may require thicker silicide contacts with lower resistance, while the vast majority of other transistors are less critical and only require thinner silicide contacts. A prior art technique provides thicker silicide layers for select transistors by using lower impurity doping concentrations in the active regions of the select transistors, while using higher concentrations for the active regions of other transistors.

SUMMARY

Some inventive principles of this patent disclosure relate to methods in which a first silicide layer is formed on a first device region of a substrate, and a second silicide layer is formed on a second device region while simultaneously further forming the first silicide layer, which may accommodate different contact areas for the first and second silicide layers. Other inventive principles of this patent disclosure relate to methods in which first and second contact holes are formed in a dielectric layer over first and second device regions of a substrate. The second contact hole may be formed after the first contact hole is formed and a silicide layer formed therein. A second silicidation may then be performed in the first and second contact holes. Additional inventive principles of this patent disclosure relate to semiconductor devices having first and second silicide layers with substantially different thicknesses in first and second device regions having different pattern densities. The first and second silicide layers may be formed over first and second active regions, respectively, that may be implanted with impurities through the same implantation process.

DETAILED DESCRIPTION

As the density and complexity of IC chips continue to increase, the type and density of various silicon features become more diverse, and thus, the size and shape requirements of contacts for these features may vary greatly. For example, a first region of a substrate may be fabricated with lower density gate patterns, and thus, more space for contacts between the gates than a second region. If the same process is used to form a silicide layer for both larger contacts in the first region and smaller contacts in the second region, it may result in either insufficient silicidation of the larger contacts or silicide encroachment around the smaller contacts.

Figure 1:
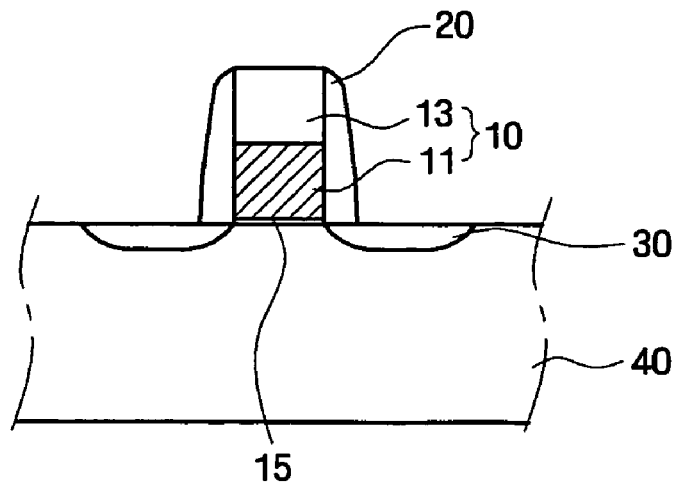
FIGS. 1-4 illustrate a prior art technique for forming silicide contacts.
Figure 2:
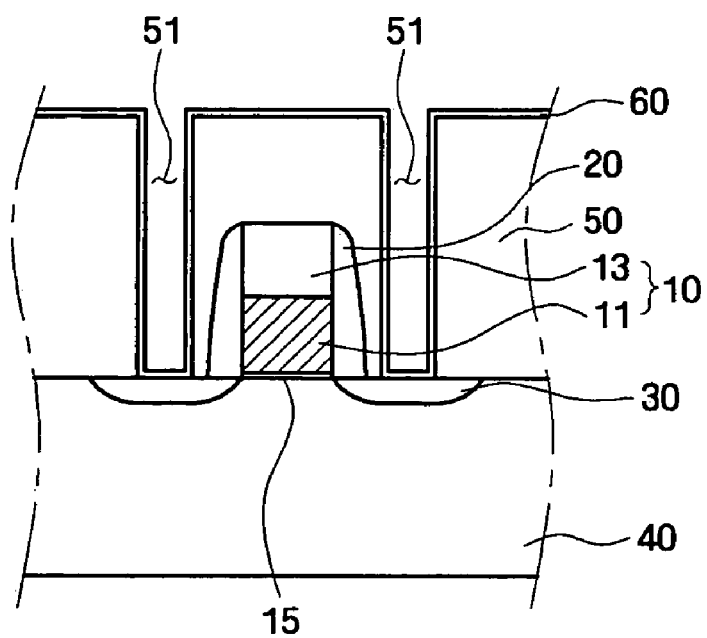
Figure 3:
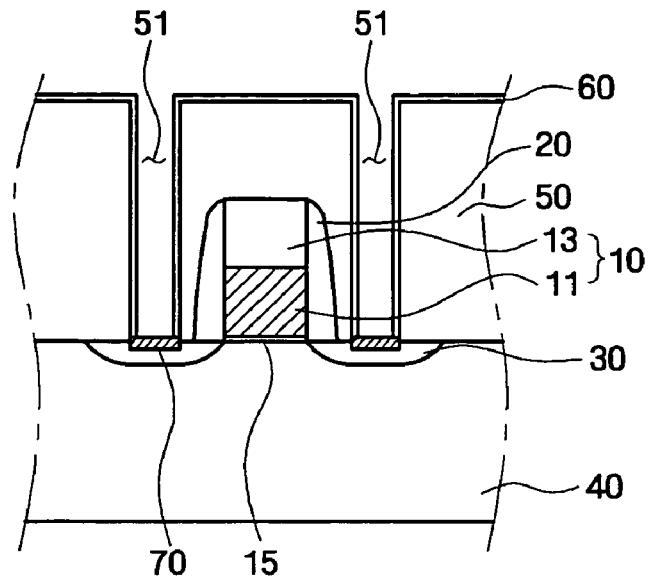
Figure 4:
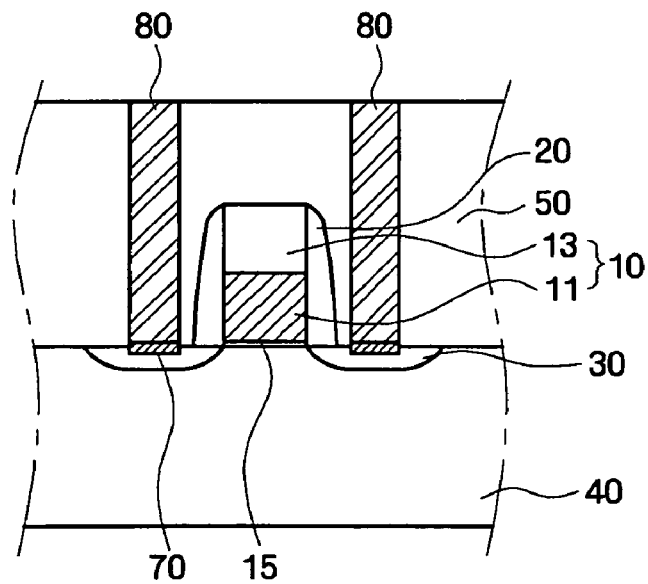
Figure 5:
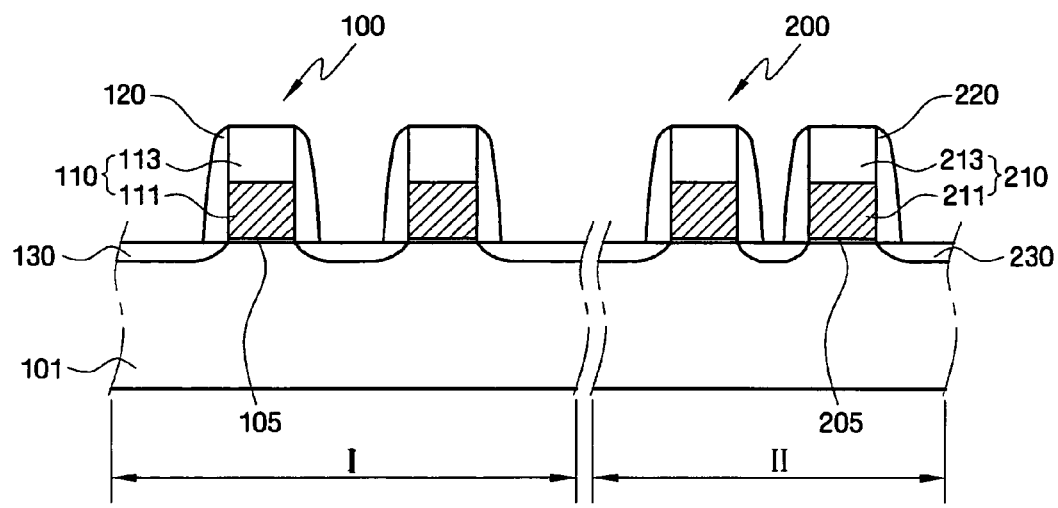
FIGS. 5-12 illustrate an embodiment of a semiconductor device and an embodiment of a method for forming silicide contacts according to the inventive principles of this patent disclosure.

FIGS. 5-12 illustrate an embodiment of a semiconductor device and an embodiment of a method for forming silicide contacts according to the inventive principles of this patent disclosure. FIG. 5 is a cross-sectional view of a semiconductor wafer including a substrate 101 having first and second device regions I and II. Device region I includes a relatively low density pattern of features, e.g., gate electrodes, whereas device region II includes a high density pattern of features. Transistors in the first device region I include active (source/drain) regions 130, gate electrodes 110 (which, in turn, include a gate layer 111 and a first hard mask layer 113), and sidewall spacers 120. Transistors in the second device region II include active regions 230, gate electrodes 210 (which include a gate layer 211 and a second hard mask layer 213), and sidewall spacers 220.

Figure 6:
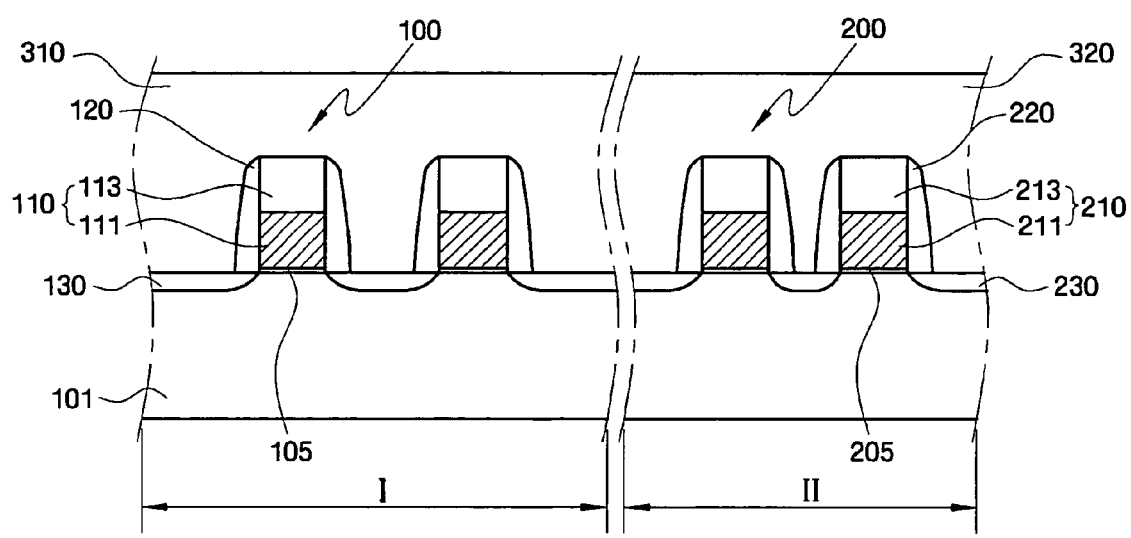
Figure 7:
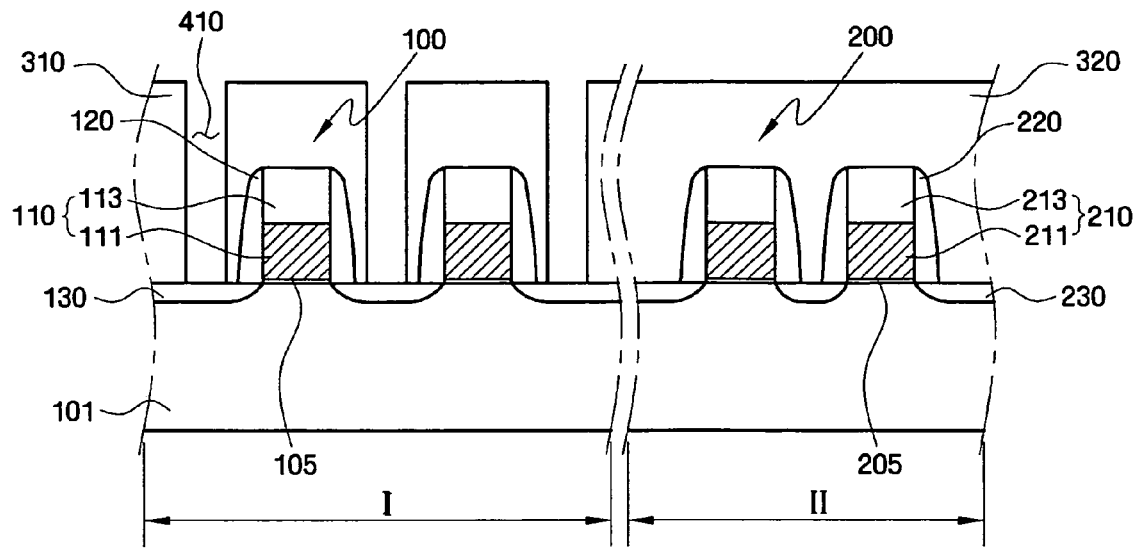

An interlayer dielectric layer, for example, an oxide layer 310,320 is deposited over both device regions I, II as shown in FIG. 6. Normal contact holes 410 are formed in the dielectric layer 310 to expose contact areas of the active regions 130 as shown in FIG. 7.

Figure 8:
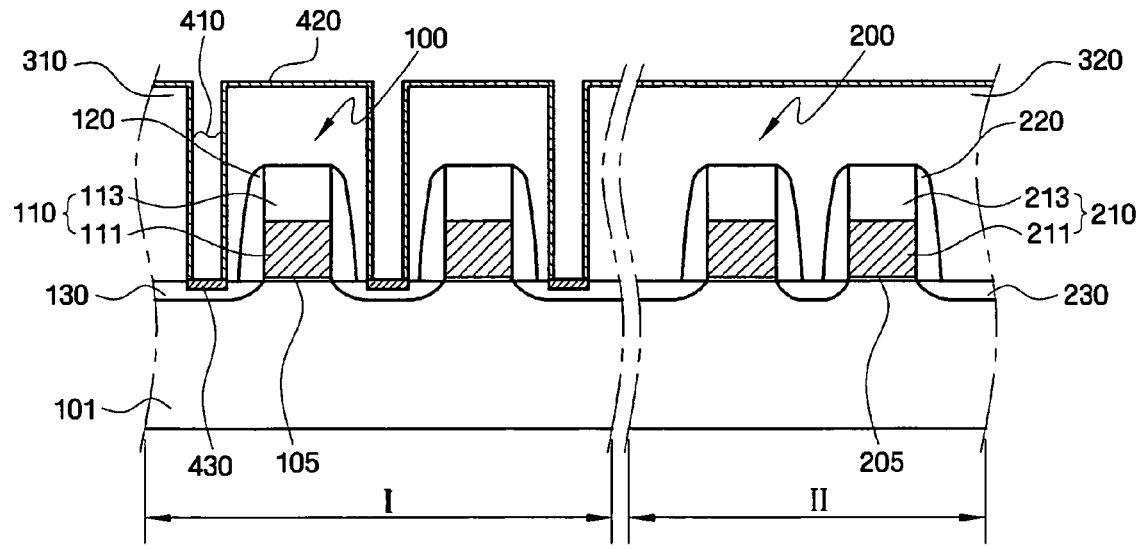

Referring to FIG. 8, a first metal layer 420 of, for example, a refractory metal such as titanium (Ti) is deposed over the substrate 101 and covers the dielectric layer 310,320 and the exposed portions of the active regions 130. The metal may be deposited by chemical vapor deposition (CVD) or any other suitable process. In one embodiment, a wafer having the dielectric layer 310,320 with contact holes 410 over the first device region I may be loaded into a chamber which is evacuated and then supplied with processing gases including titanium tetrahalide ($TiCl_4$), hydrogen ($H_2$), and argon (Ar). A plasma is produced in the chamber to deposit a titanium layer in the contact holes at a temperature that is preferably between about 400° C. and about 800° C. The titanium layer may react with silicon in the exposed portions of the active regions simultaneously as it is being deposited, forming a first silicide layer 430, in this example, titanium-silicide. Other metals may be used, for example cobalt, Nickel, etc. to form other silicides such as $CoSi_2$ or $NiSi_2$. At this point, the first silicide layer 430 is formed to a first thickness that may be insufficient to provide an appropriate amount of contact resistance for the devices formed in the first device region I.

Figure 9:
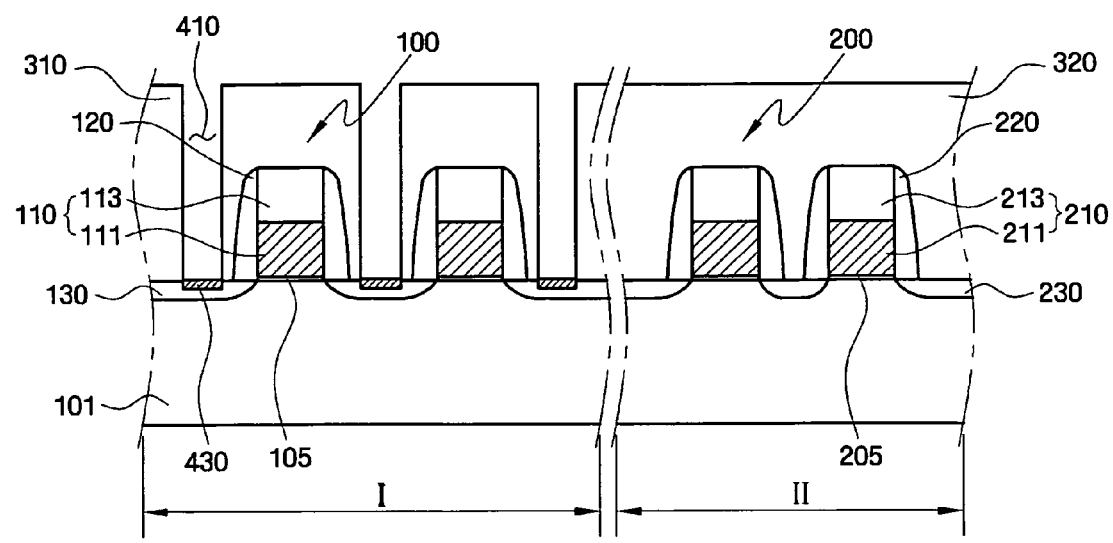

Referring to FIG. 9, unreacted metal is removed through selective etching, leaving the silicide layer 430 at the bottoms of the contact holes 410. In one embodiment, immediately after the simultaneous deposit and silicidation of the metal film, unreacted metal may be removed by exposure to a flow of titanium tetrahalide ($TiCl_4$) which etches away exposed metallic titanium, but does not etch the silicide ($TiSi_2$) on the active regions. The etching may be performed by flowing the same gases as during the deposition process, but with the plasma power off.

Figure 10:
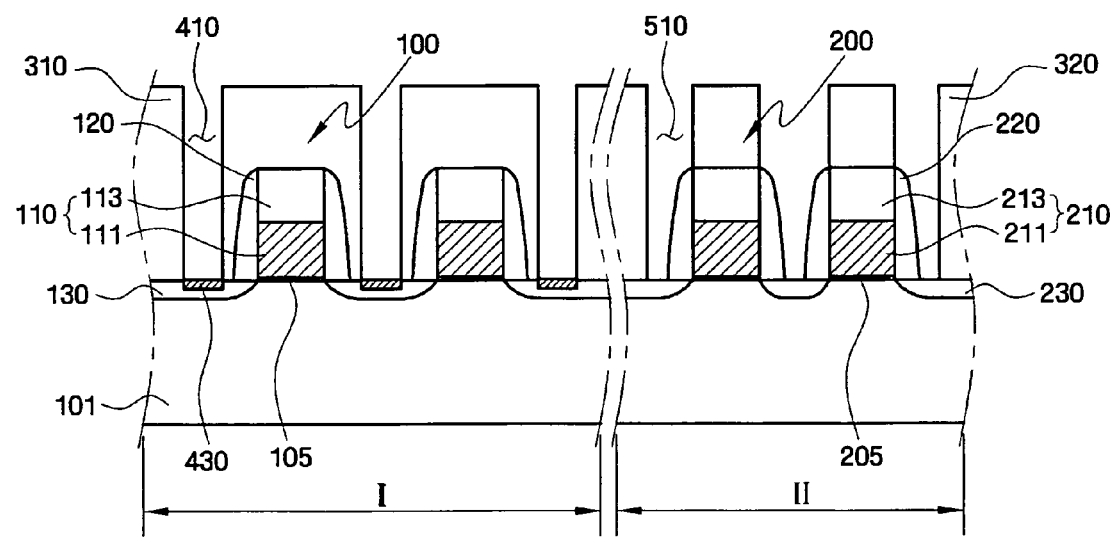

Referring to FIG. 10, second contact holes 510 are formed in the dielectric layer 320 to expose contact areas of the active regions 230 in the second device region II. In this example embodiment, the contact holes 510 are self-aligned contact holes (e.g., defined by the sidewall spacers 220) as opposed to the normal contact holes (e.g., formed through conventional photolithography techniques) 410 of the first device region I. The self-aligned contact holes 510 may be used because of the closer spacing of gate electrodes 110. Thus, the contact areas on the active regions 230 are generally smaller than those in region I, as are the silicon features, e.g., active regions.

Figure 11:
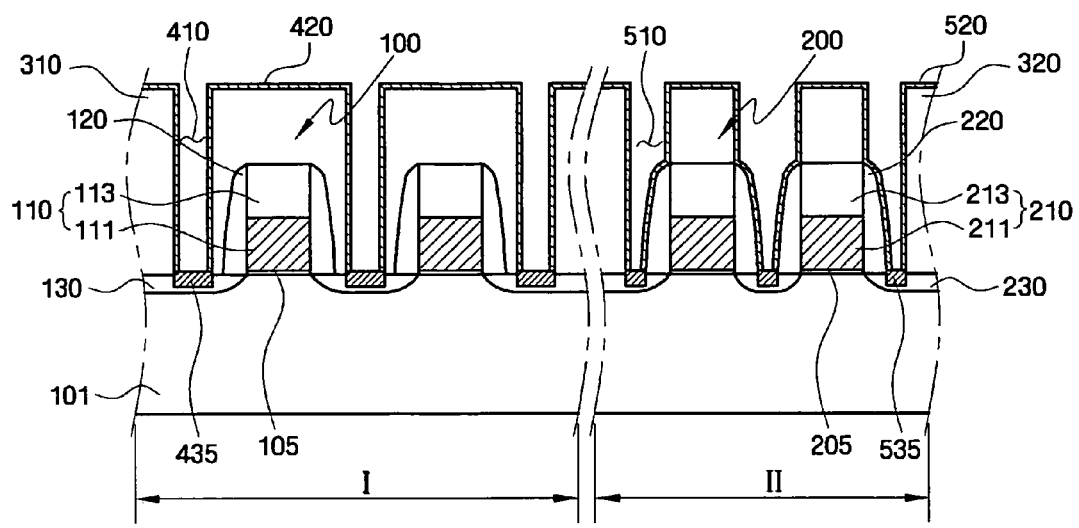

As shown in FIG. 11, a second metal layer 520, again Ti as an example, is deposited on the first silicide layer 430 in the normal contact holes 410, as well as the exposed contact areas of the active regions 230 in the self-aligned contact holes 510. The metal formed on the first silicide layer 430 further forms the silicide layer to a greater thickness as shown at 435 in FIG. 11. Metal deposited in the self-aligned contact holes 510 reacts with silicon in the active regions 230 to form a second silicide layer 535 on the second device region II. The second silicide layer 535 may be thinner than the further grown first layer 435. Thus, the inventive principles of this patent disclosure may enable the formation of a silicide layer in the second device region II having different characteristics than the silicide layer in the first region I to accommodate devices having different pattern densities, device spacing, contact areas, etc.

Figure 12:
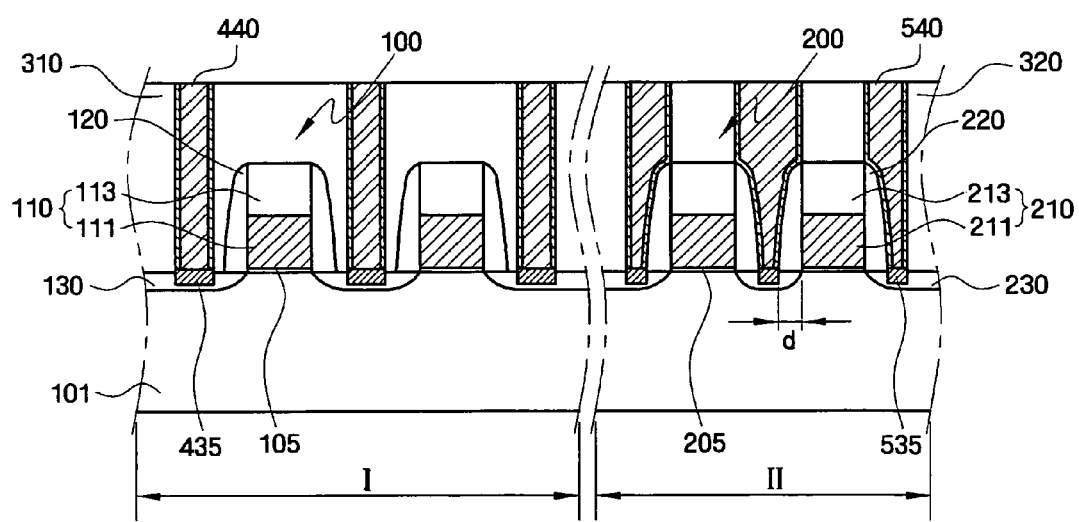

Referring to FIG. 12, unreacted metal may be removed from the top of the dielectric layer 310,320, and then metal plugs 440 and 540 are formed by filling in the normal and self-aligned contact holes 410 and 510 respectively, with a metal such as tungsten (W), copper (Cu), or aluminum (Al).

Another aspect of the inventive principles of this patent disclosure is the creation of a semiconductor structure having active regions with substantially equal doping concentrations but with substantially different silicide layers formed thereon. For example, in the embodiments of FIGS. 11 and 12 a structure may be created where active regions 130 and 230 in different device regions I and II may be implanted with impurities through the same implantation process, but then connected through contacts that have different silicide thicknesses.

The embodiments described above can be modified in arrangement and detail in accordance with the inventive concepts of this patent disclosure. For example, embodiments have been described above using titanium (Ti) to form silicides, but other refractory metals, near-noble metals, etc. may be used. Likewise, contact areas have been described as being defined by specific types of contact holes on specific types of silicon features such as source/drain regions, but the inventive principles of this patent disclosure are not limited to any specific types of contacts, contact holes, silicon features, etc. As a further example, different numbers of silicide processes maybe used to form contacts in more than two device regions. For example, one silicide process in a first region, two processes in a second region, and three processes in a third region. Therefore, such changes and modifications are considered to fall within the scope of the following claims.

The invention claimed is:

1. A method comprising:
   forming a dielectric layer over a substrate;
   forming a first contact hole in the dielectric layer over a first device region of a semiconductor substrate to expose a first source/drain region;
   performing a first silicidation in the exposed first source/drain region;
   forming a second contact hole in the dielectric layer over a second device region of the substrate to expose a second source/drain region after performing the first silicidation; and
   performing a second silicidation in the exposed first and second source/drain regions.

2. The method of claim 1 where the first contact hole is a normal contact hole.

3. The method of claim 1 where the second contact hole is a self-aligned contact hole.

4. The method of claim 1 where the second silicidation is performed simultaneously in the first and second contact holes.

5. The method of claim 1 where:
the first contact hole is formed between devices having a first pattern density; and
the second contact hole is formed between devices having a second pattern density greater than the first pattern density.

6. The method of claim 1, wherein the first and second source/drain regions are implanted with impurities through the same implantation process.

7. The method of claim 1, wherein a silicide layer formed in the first contact hole after the second silicidation is thicker than a silicide layer formed in the second contact hole after the second silicidation.

8. A method comprising:
forming a contact in a first contact hole over a first region of a substrate using a first number of silicidation processes; and
forming a contact in a second contact hole over a second region of the substrate using a second number of silicidation processes less than the first number;
wherein during the silicidation processes silicon in the substrate is reacted with metals.

9. The method of claim 8 further comprising forming a dielectric layer over the first and second regions.

10. The method of claim 9 further comprising:
forming the first contact hole in the dielectric layer over the first region; and
performing one of the silicidation processes in the first contact hole while the second region is masked by the dielectric layer.

11. The method of claim 10 further comprising:
forming the second contact hole in the dielectric layer over the second region; and
performing one of the silicidation processes in the first and second contact holes simultaneously.

12. The method of claim 8 where:
the first contact hole is a normal contact hole formed between devices having a first device spacing; and
the second contact hole is a self-aligned contact hole formed between devices having a second device spacing closer than the first device spacing.

13. The method of claim 8 further comprising:
forming a contact over a third region of the substrate using a third number of silicidation processes where the third number is less than the second number.

14. The method of claim 8 where:
the contact in the first contact hole is silicided using one metal layer; and
the contact in the second contact hole is silicided using two metal layers.

15. The method of claim 8, wherein the first and second source/drain regions are implanted with impurities through the same implantation process.

16. The method of claim 8, wherein a silicide layer formed in the first contact hole using the first number of silicidation processes is thicker than a silicide layer formed in the second contact hole using the second number of silicidation processes.

* * * * *